United States Patent [19]

Hirano

[11] Patent Number: 5,440,522
[45] Date of Patent: Aug. 8, 1995

[54] CONNECTION/DISCONNECTION CONTROL CIRCUIT FOR DATA LINES BETWEEN MEMORY GROUPS

[75] Inventor: Shin-Ichi Hirano, Tokyo, Japan

[73] Assignee: NEC Corporation, Tokyo, Japan

[21] Appl. No.: 354,136

[22] Filed: Dec. 6, 1994

[30] Foreign Application Priority Data

Dec. 6, 1993 [JP] Japan .................................. 5-305197

[51] Int. Cl.⁶ .............................................. G11C 8/00
[52] U.S. Cl. .............................. 365/230.03; 365/230.06
[58] Field of Search ...................... 365/230.01, 230.03, 365/230.06, 189.12, 219, 240

[56] References Cited

FOREIGN PATENT DOCUMENTS 4-77811 3/1992 Japan .
4-177692 6/1992 Japan .

Primary Examiner—David C. Nelms
Assistant Examiner—F. Niranjan
Attorney, Agent, or Firm—Young & Thompson

[57] ABSTRACT

A memory system comprises a plurality of memory groups, a dynamic data line provided for each of the memory groups, a memory controller, a dynamic data line division circuit, and a data transfer controller. The dynamic data line division circuit performs connection and disconnection between the dynamic data lines of two adjacent memory groups. Monitoring the data input/output control of the memory controller, the data transfer controller switches the dynamic data line division circuit to a connection mode only when data transfer occurs between the two adjacent memory groups.

15 Claims, 5 Drawing Sheets

CONNECTION/DISCONNECTION CONTROL CIRCUIT FOR DATA LINES BETWEEN MEMORY GROUPS

BACKGROUND OF THE INVENTION

1. Field of the Invention

The present invention relates to a memory device comprising a plurality of memory groups and input-/output data lines connected to the respective memory groups and, more specifically, to data line connection/-disconnection control in data transfer between memory cells.

2. Description of the Prior Art

With the improvement in the processing capability of computers, the amount of programs to be executed and data to be processed by a computer is now increasing. Accordingly, the main memory of a computer is required more than ever to have a large capacity, high processing speed, and low power consumption.

To have a large-capacity main memory operate at high speed, a circuit has been proposed in which a dynamic data line for the transfer of write/read data is divided to reduce capacitive loads. FIG. 1 shows an example of a conventional main memory data transfer circuit connecting the divided dynamic data lines. To avoid making the drawing unduly complex, it is assumed that the main memory is comprised of four memory cells.

In FIG. 1, data writing to and data reading from a first memory group 110 and a second memory group 111 are effected by write control signal W and read control signal R which are supplied from a first memory control circuit 112 and a second memory control circuit 113 to the memory groups 110 and 111, respectively. The input/output terminals for the first memory group 110 are connected to a first dynamic data line 114, and the input/output terminals for the second memory group 111 are connected to a second dynamic data line 115. The first and second dynamic data lines 114 and 115 are separated from each other by a dynamic data line division circuit 116. That is, the division circuit 116 connects or disconnects the dynamic data lines 114 and 115 based on clock signals CLK and CLKI. The respective components will be described below.

The first memory group 110 is comprised of four memory cell devices M11–M14, and the second memory group 111 is comprised of four memory cell devices M21–M24. One of the cell devices is selected using a 3-bit write address (A, B, C) or a 3-bit read address (D, E, F). It is to be noted that inverted signals AI, BI, CI, DI, EI, and FI of the above address signals are also used.

For example, where memory cell device M11 is selected by the write address (A, B, C), data is input and written to the memory cell device M11 via the first dynamic data line 114 when the clock signal CLK has a value of "1" and write control signal W1 having a value "1" is input from the first memory control circuit 112 to the memory cell device M11. Where the memory cell device M21 is selected by the read address (D, E, F), data is output from the memory cell device M21 to the second dynamic data line 115 when clock signal CLK has a value of "1" and the read control signal R5 having a value of "1" is input from the second memory control circuit 113 to the memory cell device M21.

When the clock signal CLK has a value of "1", the first memory control circuit 112 decodes write address signals A–C and AI–CI and read address signals D–F and DI–FI and supplies write control signals W1–W4 and read control signals R1–R4 to memory cell devices M11–M14 of the first memory group 110. When the clock signal CLK has a value of "1", the second memory control circuit 113 decodes write address signals A–C and AI–CI and read address signals D–F and DI–FI and supplies write control signals W5–W8 and read control signals R5–R8 to memory cell devices M21–M24 of the second memory group 111. Table 1 shows the corresponding relationships between the write address (A, B, C) and write control signals W1–W8 and between the read address (D, E, F) and read control signals R1–R8.

TABLE 1

| Address correspondence table | | | | | | |
|---|---|---|---|---|---|---|
| Write address | | | | Read address | | |
| A | B | C | | D | E | F |
| W1 | 1 | 0 | 1 | R1 | 1 | 0 | 1 |
| W2 | 1 | 1 | 0 | R2 | 1 | 1 | 0 |
| W3 | 0 | 1 | 0 | R3 | 0 | 1 | 0 |
| W4 | 0 | 1 | 1 | R4 | 0 | 1 | 1 |
| W5 | 1 | 1 | 1 | R5 | 1 | 1 | 1 |
| W6 | 0 | 0 | 0 | R6 | 0 | 0 | 0 |
| W7 | 1 | 0 | 0 | R7 | 1 | 0 | 0 |
| W8 | 0 | 0 | 1 | R8 | 0 | 0 | 1 |

A decoder section of each of the first and second memory control circuits 112 and 113 is comprised of 24 NMOS transistors and is known well. When the clock signal CLK has a value of "1", a gate circuit of each of the memory control circuits 112 and 113 transfers a write control signal W or a read control signal R to the associated memory cell device.

The dynamic data line division circuit 116 is composed of two PMOS transistors, Q1 and Q2, two NMOS transistors, Q3 and Q4, and two NOR gates 117 and 118. PMOS transistors Q1 and Q2 precharge the first and second dynamic data lines 114 and 115 when the clock signal CLK is "0". NMOS transistors Q3 and Q4 performs data transfer between the first and second memory groups 110 and 111 when the clock signal CLK is "1".

Although the above conventional circuit can reduce capacitive loads by dividing the dynamic data line to thereby truly enable high-speed operation, it still has the following problems. Since the division circuit 116 effects data transfer between the first and second memory groups 110 and 111 when the clock signal CLK is "1", even when it is intended to transfer data within one of the memory groups 110 and 111 via one of the dynamic data lines 114 and 115, the data is transferred to the other dynamic data line via the division circuit 116. In other words, even when it is intended to transfer data via one dynamic data line, the other dynamic data line is also driven. Therefore, the power consumption cannot be reduced sufficiently.

In microprocessors commercially available, the internal bus width is increased with the increase in the instruction length. Currently, even microprocessors having a 64-bit bus structure are now on the market. Further, to improve performance, there have been developed microprocessors whose internal operating frequency is more than 200 MHz. Since an increase in the power consumption causes a temperature increase in the device, thereby making it difficult to put the device into actual production, the power consumption is an important design factor.

In Japanese Unexamined Patent Publication No. Hei. 4-177692, there has been disclosed a semiconductor memory device in which a bit line is divided through the insertion of a transfer gate. In this memory device, the power consumption is reduced by dividing the bit line and isolating, by using a sense amplifier, a bit line portion that does not relate to the memory operation.

In Japanese Unexamined Patent Publication No. Hei. 4-77811, a semiconductor device which reduces the load on a dynamic data line is disclosed. In this semiconductor device, high-speed operation is realized by reducing the load by connecting a plurality of memory groups to the dynamic data line through switches.

SUMMARY OF THE INVENTION

An object of the present invention is to provide a memory device which can realize low power consumption as well as large capacity and high-speed operation.

Another object of the invention is to provide a data transfer control which can reduce the power consumption of a memory device that has a large capacity and operates at high speed.

According to the invention, the data input/output lines for two memory groups are connected to each other only when data transfer is performed between the two memory groups, and are disconnected in other cases.

A memory system according to the invention comprises a plurality of memory groups each having a plurality of memory cells, and a data line provided for each of the plurality of memory groups and commonly connected to the input/output terminals of the memory cells. A memory controller performs data input/output control for all of the memory cells. A data line division circuit performs electrical connection and disconnection between the data lines of arbitrary two adjacent memory groups of the plurality of memory groups. Monitoring the data input/output control by the memory controller, a data transfer control circuit switches the data line division circuit to a connection mode only when data transfer is performed between the two adjacent memory groups.

Preferably, the data line division circuit is provided with a gate circuit for each data transfer direction. These gate circuits are capable of connecting the data lines bi-directionally or only in the data transfer direction in accordance with a transfer control signal sent from the data transfer control circuit.

It is preferable that a prescribed single bit of the address to be used for data input/output control have a prescribed logical value for discriminating between the two adjacent memory groups. The data transfer control circuit detects a data transfer between memory groups by monitoring the prescribed bit. That is, the data transfer control circuit monitors at least the prescribed bit of the address, and detects, based on the detected prescribed bit value, whether data transfer is performed between the two adjacent memory groups or not. Further, the data transfer control circuit can detect the direction of an intermemory-group data transfer using the prescribed bit of a write address and the prescribed bit of a read address.

DESCRIPTION OF THE PREFERRED EMBODIMENTS

For simplification, a description will be made of a memory device comprising two memory groups each having four memory cell devices. This configuration is used only for a simplified description; each memory group actually has a large number of memory cell devices, and writing to and reading from these memory cell devices are effected by an address having a number of bits large enough to select among these memory cell devices.

FIRST EMBODIMENT

Figure 1:
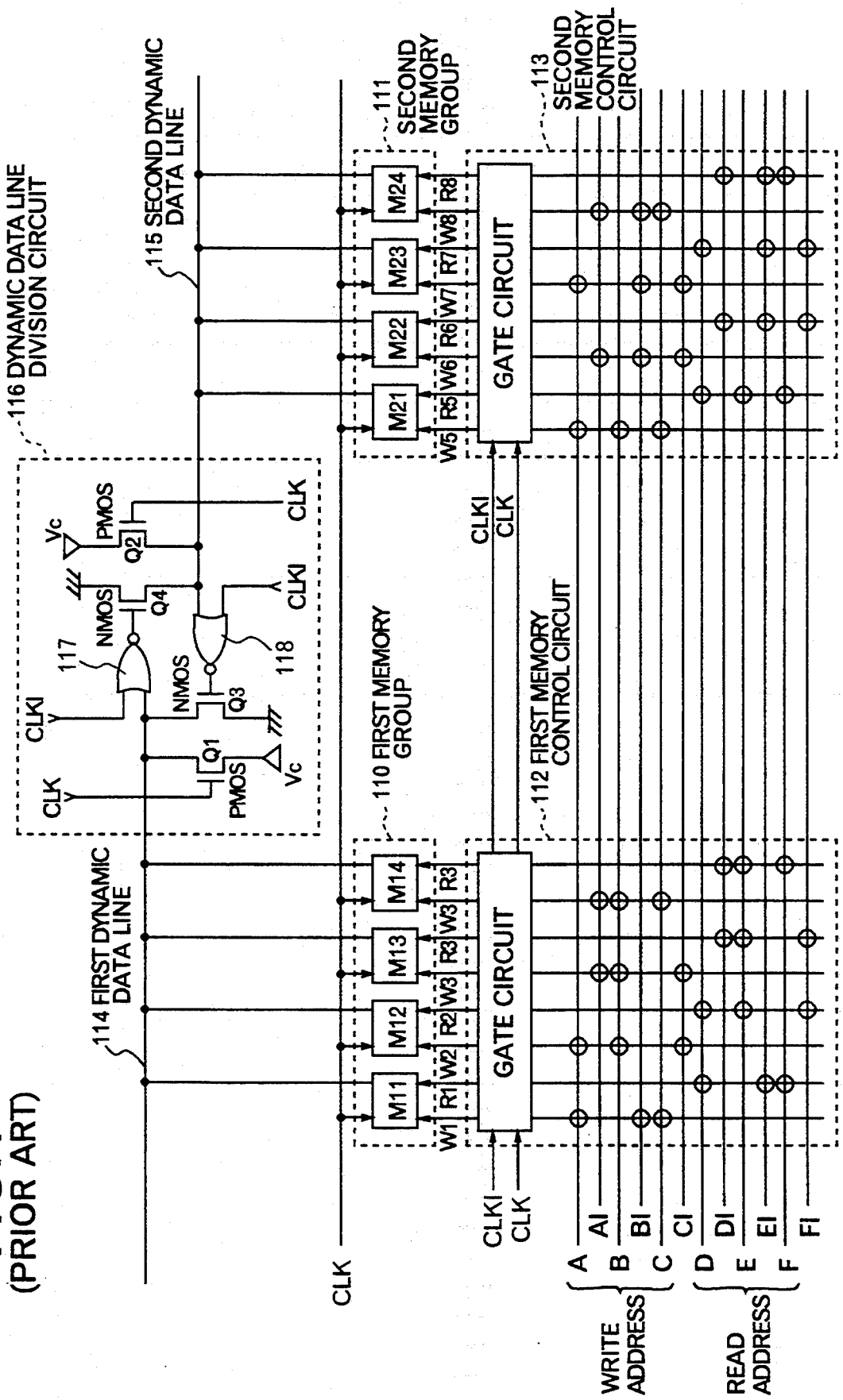
FIG. 1 is a circuit diagram showing an example of a conventional memory device.
Figure 2:
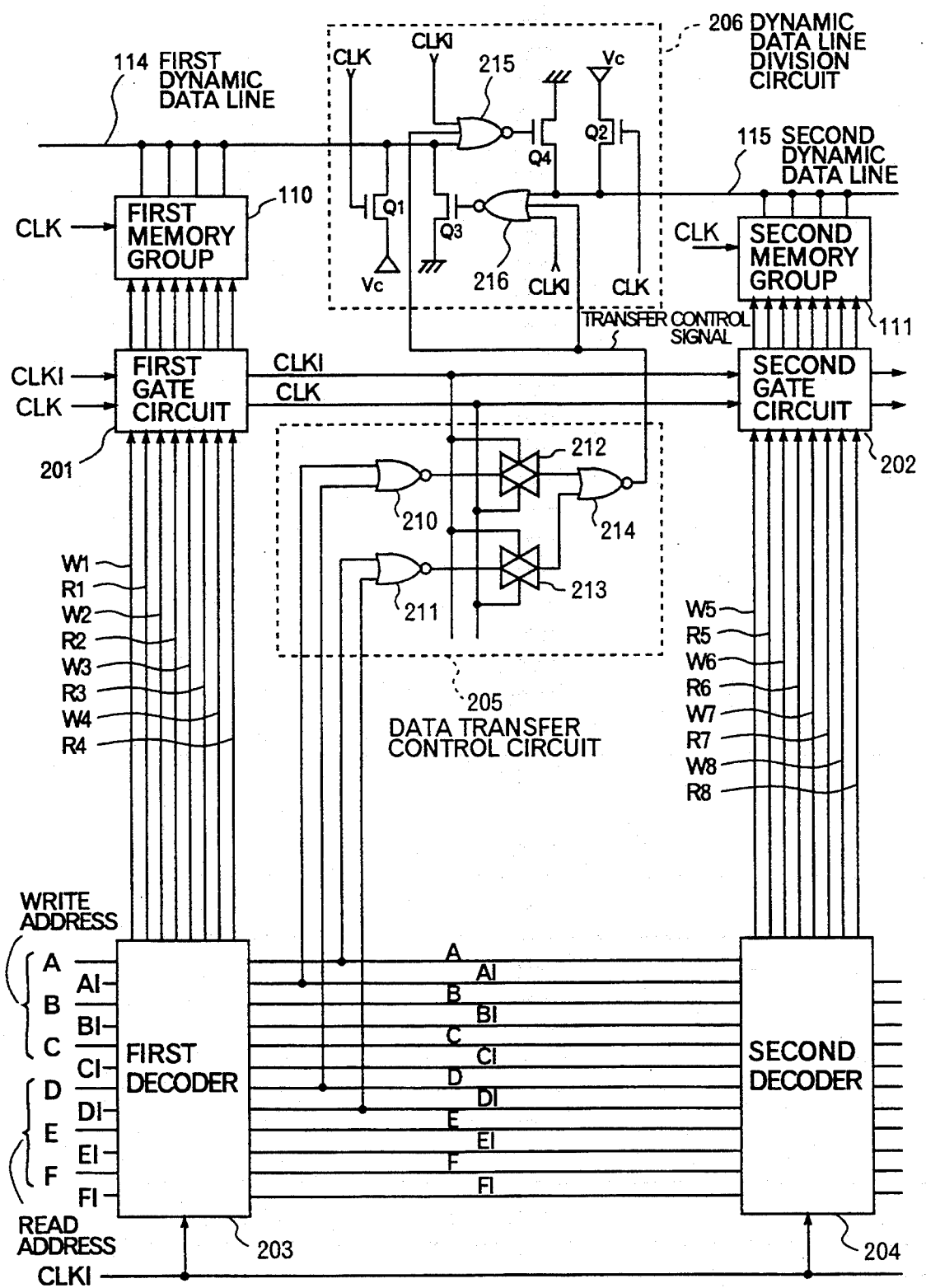
FIG. 2 is a circuit diagram showing a memory device according to an embodiment of the present invention.

As illustrated in FIG. 2, the input/output terminals for a first memory group 110 are commonly connected to a first dynamic data line 114, and the input/output terminals for a second memory group 111 are commonly connected to a second dynamic data line 115. Writing control and reading control for the first memory group 110 are performed by a first memory control circuit that is comprised of a first gate circuit 201 and a first decoder 203. Similarly, writing control and reading control for the second memory group 111 are performed by a second memory control circuit that is comprised of a second gate circuit 202 and a first decoder 204.

Each of the first decoder 203 and the second decoder 204 selects one memory cell device based on a write address (A, B, C) and a read address (D, E, F), and supplies a write control signal W or a read control signal R to the selected memory cell device. It should be noted that the first and second decoders 203 and 204 select among the memory cell devices based on not only address signals A–F but also inverted signals AI–FI of these address signals.

Using part of the write address and the read address, a data transfer control circuit 205 continuously monitors an intermemory-group data transfer operation in which data is transferred from one memory group to the other memory group. As described later, in this embodiment, an intermemory-group transfer is detected using address signal A that is the most significant bit (MSB) of the write address (A, B, C), its inverted address signal AI, address signal D that is the MSB of the read address (D, E, F), and its inverted address signal DI.

In FIG. 2, the data transfer control circuit 205 receives the part of the address signals through NOR circuits 210 and 211. An output of the NOR circuit 210 is input to a NOR circuit 214 via an analog switch 212, and an output of the NOR circuit 211 is also input to the NOR circuit 214 via an analog switch 213. The analog switches 212 and 213 become conductive when the clock signal CLK is "1". Receiving the outputs of the NOR circuits 210 and 211, the NOR circuit 214 supplies a division circuit 206 with a transfer control signal indicating whether the transfer is an intermemory-group transfer. As described later in detail, the division circuit 206 performs data transfer from one dynamic data line to the other only in the case of an intermemory-group transfer.

The transfer control signal from the data transfer control circuit 205 is input to NOR circuits 215 and 216 of the division circuits 206. The NOR circuit 215 receives, in addition to the transfer control signal, a data signal from the first dynamic data line 114 and the inverted clock signal CLKI. The NOR circuit 216 receives, in addition to the transfer control signal, a data signal from the second dynamic data line 115 and the inverted clock signal CLKI.

The first dynamic data line 114 is supplied with a prescribed voltage via PMOS transistor Q1. When the clock signal CLK is "0" the PMOS transistor Q1 becomes conductive and the first dynamic data line 114 is precharged. Similarly, the second dynamic data line 115 is supplied with a prescribed voltage via PMOS transistor Q2. When the clock signal CLK is "0", the PMOS transistor Q2 becomes conductive and the second dynamic data line 115 is precharged.

An output of the NOR circuit 215 is input to the gate of NMOS transistor Q4. When the output of the NOR circuit 215 is "1" data is transferred from the first dynamic data line 114 to the second dynamic data line 115 via the NMOS transistor Q4. On the other hand, an output of the NOR circuit 216 is input to the gate of NMOS transistor Q3. When the output of the NOR circuit 216 is "1" data is transferred from the second dynamic data line 115 to the first dynamic data line 114 via the NMOS transistor Q3.

Figure 3:
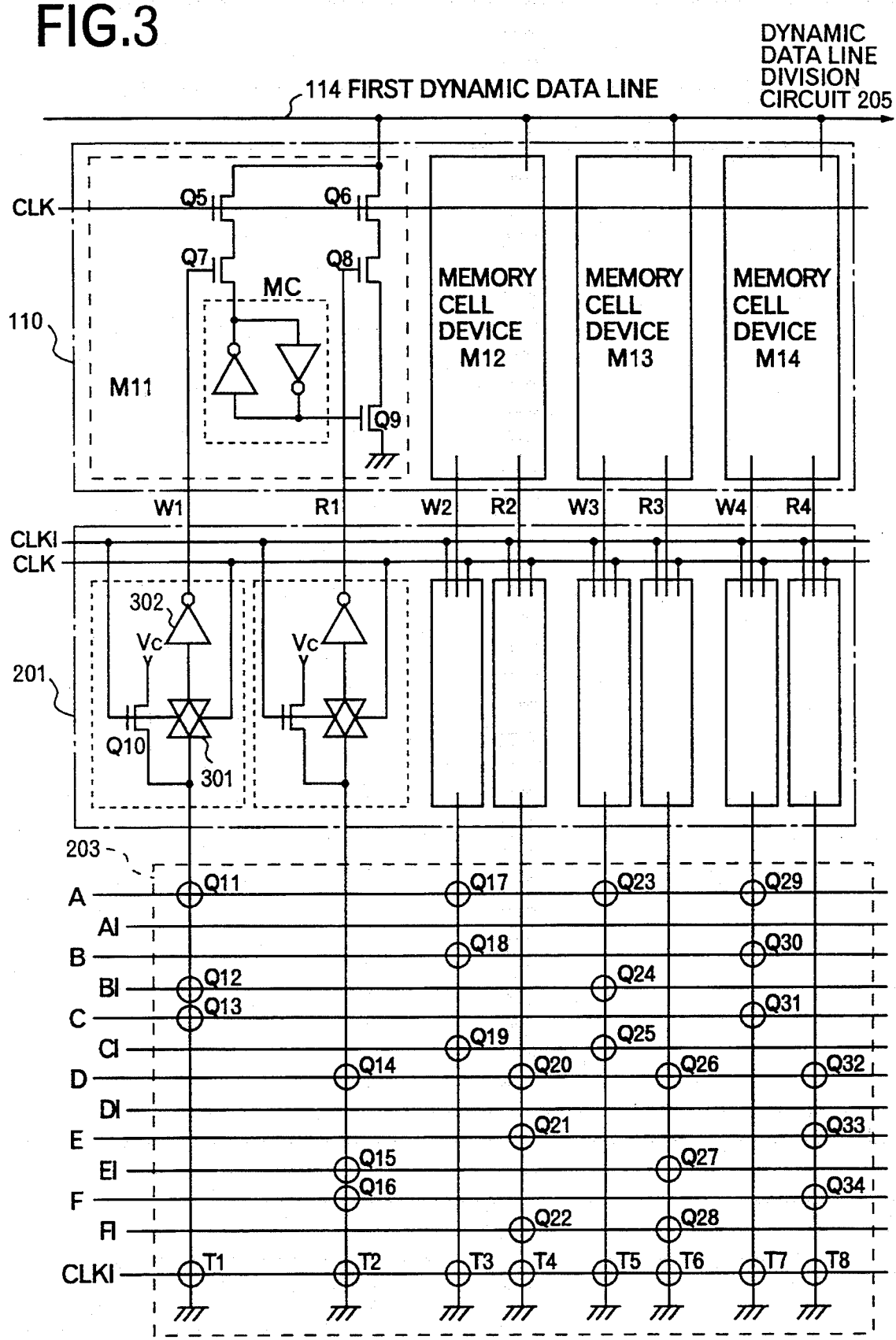
FIG. 3 is a more detailed circuit diagram showing a first memory group, a first gate circuit and a first decoder in FIG. 4 is a more detailed circuit diagram showing a second memory group, a second gate circuit, and a second decoder in FIG. 2.

As shown in FIG. 3, the first memory group 110 of this embodiment is comprised of four memory cell devices M11-M14. Each memory cell device has a memory cell MC, NMOS transistors Q5 and Q6 that become conductive when the clock signal CLK is "1", a NMOS transistor Q7 that becomes conductive when the write control signal W is "1", a NMOS transistor Q8 that becomes conductive when the read control signal R is "1", and a NMOS transistor Q9 for reading data from the memory cell MC. For example, in the case of memory cell device M11, data is written to memory cell MC from the first dynamic data line 114 when the write control signal W1 is "1" and the clock signal CLK is "1". Conversely, data stored in memory cell MC is read out to the first dynamic data line 114 when the read control signal R1 is "1" and the clock signal CLK is "1".

The first gate circuit 201 is comprised of eight gate circuits, which supply write control signals W and read control signals R to the memory cell devices. Each gate circuit is composed of an analog switch 301, a NMOS transistor Q10, and an inverter 302. When clock signal CLK is "1", the analog switch 301 becomes conductive to thereby enable the write control signal W or the read control signal R to be sent from the first decoder 203 to the memory cell device via the inverter 302.

The first decoder 203 is composed of 12 address lines for receiving address signals A-F and inverted address signals AI-FI, eight control signal lines, 24 NMOS transistors Q11-Q34 that are arranged in accordance with a prescribed address bit allocation scheme, and NMOS transistors T1-T8 for grounding the control signal lines. One of memory cell devices M11-M14 of the first memory group 110 is selected in accordance with the address signals, and write control signal W or read control signal R is supplied to the selected memory cell device via the gate circuit.

Figure 4:
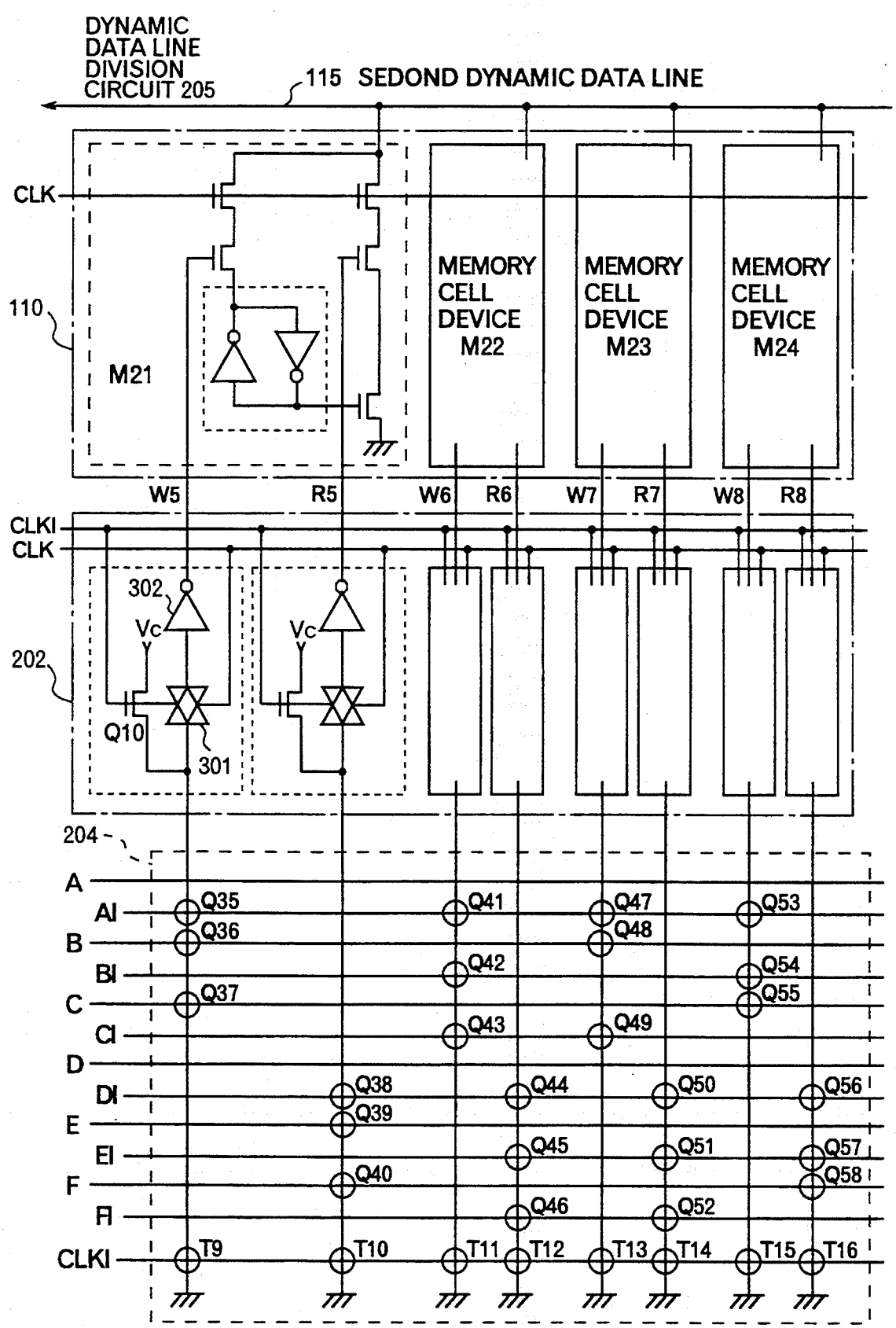

The second memory group 111, second gate circuit 202, and second decoder 204 shown in FIG. 4 have the same configurations as the corresponding components shown in FIG. 3. That is, the second memory group 111 consists of four memory cell devices M21-M24 each having the same configuration as memory cell device M11 shown in FIG. 3. The second gate circuit 202 has the same configuration as the first gate circuit 201 shown in FIG. 3. The second decoder 204 is composed of 12 address lines for receiving address signals A-F and inverted address signals AI-FI, eight control signal lines, 24 NMOS transistors Q35-Q58 that are arranged in accordance with a prescribed address bit allocation scheme, and NMOS transistors T9-T16 for grounding the control signal lines. One of memory cell devices M21-M24 of the second memory group 111 is selected in accordance with the address signals, and write control signal W or read control signal R is supplied to the selected memory cell device via the gate circuit.

This embodiment employs corresponding relationships between the write address (A, B, C) and the write control signals W1-W8 and between the read address (D, E, F) and the read control signals R1-R8, which are shown in Table 2.

TABLE 2

| Address correspondence table | | | | | | |
|---|---|---|---|---|---|---|
| Write address | | | | Read address | | |
| | A | B | C | | D | E | F |
| W1 | 1 | 0 | 1 | R1 | 1 | 0 | 1 |
| W2 | 1 | 1 | 0 | R2 | 1 | 1 | 0 |
| W3 | 1 | 0 | 0 | R3 | 1 | 0 | 0 |
| W4 | 1 | 1 | 1 | R4 | 1 | 1 | 1 |
| W5 | 0 | 1 | 1 | R5 | 0 | 1 | 1 |
| W6 | 0 | 0 | 0 | R6 | 0 | 0 | 0 |
| W7 | 0 | 1 | 0 | R7 | 0 | 1 | 0 |
| W8 | 0 | 0 | 1 | R8 | 0 | 0 | 1 |

As described in the above table, the write control signals W1-W4 are output by the first decoder 203 when the write address signal A that is the MSB of the write address (A, B, C) is "1", and the read control signals R1-R4 are output from the first decoder 203 when the read address signal D that is the MSB of the read address (D, E, F) is "1". The write control signals W5-W8 are output from the second decoder 204 when the write address signal A that is the MSB of the write address (A, B, C) is "0", and the read control signals R5-R8 are output from the second decoder 204 when the read address signal D that is the MSB of the read address (D, E, F) is "0".

Transfer operation within the same memory group

A description will be made of an operation when the write address (A, B, C) is (1, 0, 1) and the read address (D, E, F) is (1, 1, 0). Since the read address (D, E, F) is (1, 1, 0), the read control signal R2 is supplied from the first decoder 203 to the memory cell device M12 of the first memory group 110, as seen from the address correspondence table shown in Table 2. Further, since the write address (A, B, C) is (1, 0, 1), the write control signal W1 is supplied from the first decoder 203 to the memory cell device M11 of the first memory group 110. As a result, data transfer is effected from the memory cell device M12 of the first memory group 110 to the memory cell device M11 of the same memory group 110 via the first dynamic data line 114.

In the above operation, since the read address signal D, which is supplied to one of the input terminals of the NOR circuit 210 of the data transfer control circuit 205, has a value of "1", the output signal of the NOR circuit 210 is "0". Since the write address signal A, which is supplied to one of the input terminals of the NOR circuit 211, has a value of "1" the output signal of the NOR circuit 211 is also "0". Therefore, receiving the output signals of the NOR circuits 210 and 211 that are sent via the respective analog switches 212 and 213 during data transfer (when the clock signal CLK is "1"), the NOR circuit 214 has an output signal value of "1". As a result, the output signals of both NOR circuits 215 and 216 of the division circuit 206 become "0". In this manner, both of the NMOS transistor Q4 receiving the output signal of the NOR circuit 215 at its gate and the NMOS transistor Q3 receiving the output signal of the NOR circuit 216 at its gate are rendered nonconductive, so that data transfer between the first and second memory groups 110 and 111 is inhibited.

In this embodiment, an operation similar to the above is always performed when the write address signal A that is the MSB of the write address (A, B, C) is "1" and the read address signal D that is the MSB of the read address (D, E, F) is "1". Therefore, data transfer within the first memory group 110 has no influence on the second dynamic data line 115.

A description will be made next of an operation when the write address (A, B, C) is (0, 0, 1) and the read address (D, E, F) is (0, 1, 0). Since the read address (D, E, F) is (0, 1, 0), the read control signal R7 is supplied from the second decoder 204 to the memory cell device M23 of the second memory group 111, as seen from the address correspondence table shown in Table 2. Further, since the write address (A, B, C) is (0, 0, 1), the write control signal W8 is supplied from the second decoder 204 to the memory cell device M24 of the second memory group 111. As a result, data transfer is effected from the memory cell device M23 of the second memory group 111 to the memory cell device M24 of the same memory group 111 via the second dynamic data line 115.

In the above operation, since the read address signal AI, which is supplied to one of the input terminals of the NOR circuit 210, has a value of "1", the output signal of the NOR circuit 210 is "0". Since the write address signal DI, which is supplied to one of the input terminals of the NOR circuit 211, has a value of "1", the output signal of the NOR circuit 211 is also "0". Therefore, receiving the output signals of the NOR circuits 210 and 211 sent via the respective analog switches 212 and 213 during data transfer (clock signal CLK is "1"), the NOR circuit 214 has an output signal value-of "1". As a result, the output signals of both NOR circuits 215 and 216 of the division circuit 206 become "0". In this manner, both of the NMOS transistor Q4 receiving the output signal of the NOR circuit 215 at its gate and the NMOS transistor Q3 receiving the output signal of the NOR circuit 216 at its gate are rendered nonconductive, so that data transfer between the first and second memory groups 110 and 111 is inhibited.

An operation similar to the above is always performed when the write address signal A that is the MSB of the write address (A, B, C) is "0" and the read address signal D that is the MSB of the read address (D, E, F) is "0". Therefore, data transfer within the second memory group 111 has no influence on the first dynamic data line 114.

Transfer operation to the other memory group

A description will be made of an operation when the write address (A, B, C) is (1, 0, 1) and the read address (D, E, F) is (0, 1, 0). Since the read address (D, E, F) is (0, 1, 0), the read control signal R7 is supplied by the second decoder 204 to the memory cell device M23 of the second memory group 111, as seen from the address correspondence table shown in Table 2. Further, since the write address (A, B, C) is (1, 0, 1), the write control signal W1 is supplied from the first decoder 203 to the memory cell device M11 of the first memory group 110.

In the above operation, since both the write address signal AI and the read address signal D, which are supplied to the two input terminals of the NOR circuit 210 of the data transfer control circuit 205, have a value of "0", the output signal of the NOR circuit 210 is "1". Therefore, receiving the output signals of the NOR circuits 210 and 211 that are sent via the respective analog switches 212 and 213 during data transfer (clock signal CLK is "1"), the NOR circuit 214 has an output signal value of "0". As a result, the output signals of the NOR circuits 215 and 216 of the division circuit 206 depend on the logical values of the signals on the first dynamic data line 114 and the second dynamic data line 115, respectively. In this manner, data transfer between the first and second memory groups 110 and 111 is enabled.

Since data transfer between the memory groups 110 and 111 is enabled, data is transferred from the memory cell device M23 of the second memory group 111 to the memory cell device M11 of the first memory group 110 via the second dynamic data line 115, the division circuit 206 and the first dynamic data line 114. A similar operation is always performed when the write address signal A that is the MSB of the write address (A, B, C) is "1" and the read address signal D that is the MSB of read address (D, E, F) is "0".

A description will next be made of an operation when the write address (A, B, C) is (0, 0, 1) and the read address (D, E, F) is (1, 1, 0). Since the read address (D, E, F) is (1, 1, 0), the read control signal R2 is supplied by the first decoder 203 to memory cell device M12 of the first memory group 110, as seen from the address correspondence table shown in Table 2. Further, since the write address (A, B, C) is (0, 0, 1), the write control signal W8 is supplied by the second decoder 204 to the memory cell device M24 of the second memory group 111.

In the above operation, since both the write address signal A and the read address signal DI, which are supplied to the two input terminals of the NOR circuit 211, have a value of "0", the output signal of the NOR circuit 211 is "1". Therefore, receiving the output signals of the NOR circuits 210 and 211 that are sent via the respective analog switches 212 and 213 during data transfer (clock signal CLK is "1"), the NOR circuit 214 has an output signal value of "0". As a result, the output signals of the NOR circuits 215 and 216 of the division circuit 206 depend on the logical values of the signals on the first dynamic data line 114 and the second dynamic data line 115, respectively. In this manner, data transfer between the first and second memory groups 110 and 111 is enabled.

Thus, data is transferred from the memory cell device M12 of the first memory group 110 to the memory cell device M24 of the second memory group 111 via the first dynamic data line 114, the division circuit 206, and the second dynamic data line 115. A similar operation is always performed when the write address signal A that is the MSB of the write address (A, B, C) is "0" and the read address signal D that is the MSB of the read address (D, E, F) is "1".

SECOND EMBODIMENT

Figure 5:
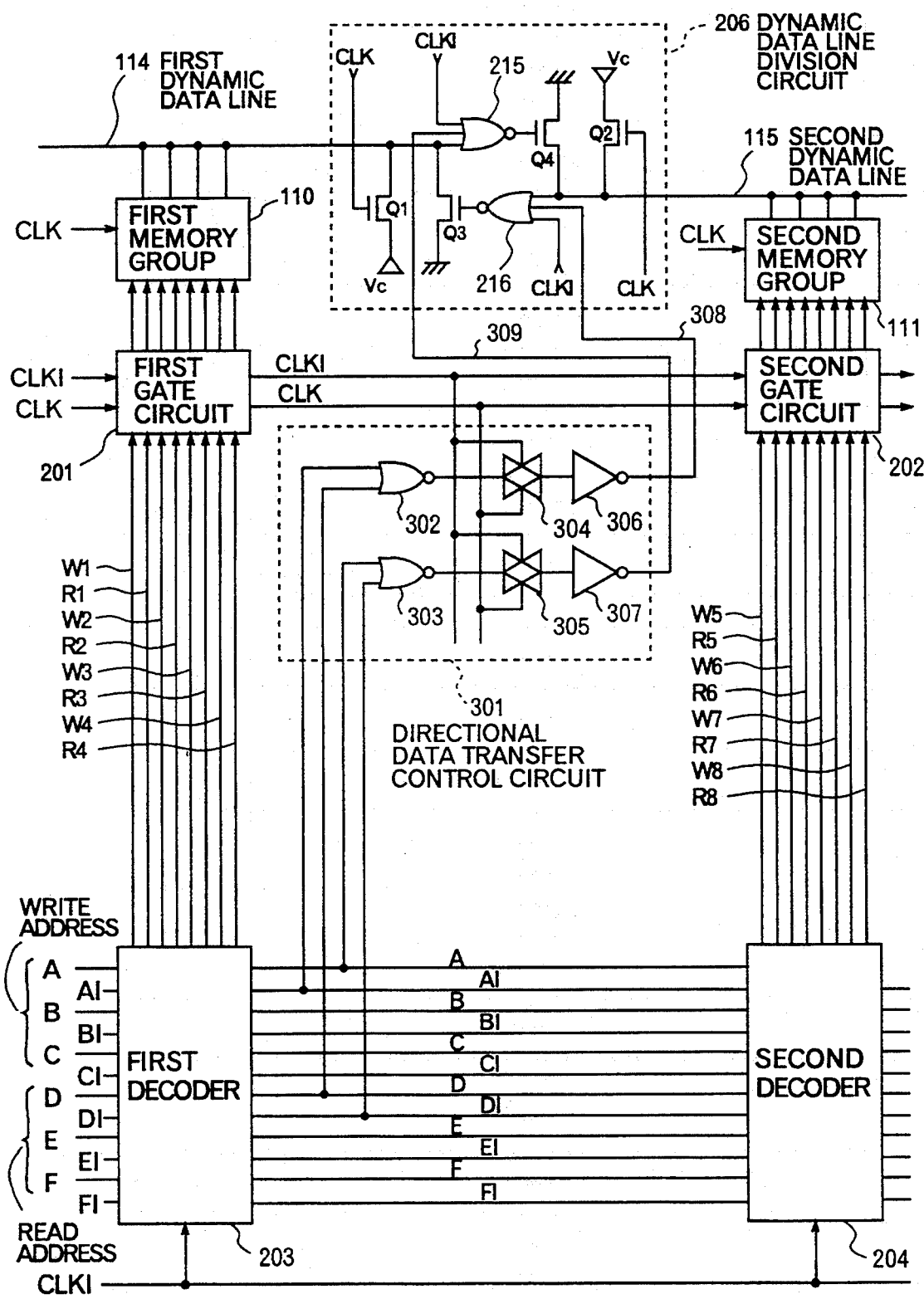
FIG. 5 is a circuit diagram showing a memory device according to another embodiment of the invention.

FIG. 5 shows a memory device according to a second embodiment of the present invention. In this embodiment, the division circuit 206 is controlled by detecting not only a data transfer between the memory groups but also its direction.

A data transfer control circuit 301 of this embodiment receives the part of the address signals via NOR circuits 302 and 303. An output of the NOR circuit 302 is input to an inverter 306 1via an analog switch 304, and an output of the NOR circuit 303 is input to an inverter 307 via an analog switch 305. The analog switches 304 and 305 become conductive when the clock signal CLK is "1". An output signal 308 of the inverter 306 is input to the NOR circuit 216 of the division circuit 206, and an output signal 309 of the inverter 307 is input to the NOR circuit 215 of the division circuit 206. The other configuration of the division circuit 206 is the same as in the first embodiment.

Transfer operation within the same memory group

As in the case of the first embodiment, a description will be made of an operation when the write address (A, B, C) is (1, 0, 1) and the read address (D, E, F) is (1, 1, 0). In this case, since, as described above, the output signals of both NOR circuits 302 and 303 of the data transfer control circuit 301 are "0", the output signals 308 and 309 of both inverters 306 and 307 become "1". Therefore, the output signals of both NOR circuits 216 and 215 of the division circuit 206 become "0"; accordingly transistors Q3 and Q4 are rendered non-conductive, so that data transfer between the first and second memory groups 110 and 111 is inhibited. That is, in this case, data is transferred from the memory cell device M12 of the first memory group 110 to the memory cell device M11 of the same memory group 110 via the first dynamic data line 114. In this operation, the data transfer has no influence on the second dynamic data line 115. An operation similar to the above is always performed when the MSB of the write address is "1" and the MSB of the read address is "1".

A description will next be made of an operation when the write address (A, B, C) is (0, 0, 1) and the read address (D, E, F) is (0, 1, 0). In this case, as described above, data is transferred from the memory cell device M23 of the second memory group 111 to the memory cell device M24 of the second memory group via the second dynamic data line 115. In this case, the output signals of both NOR circuits 302 and 303 of the data transfer control circuit 301 are "0", data transfer via the division circuit 206 is inhibited as described above.

Transfer operation to the other memory group

A description will be made of an operation when the write address (A, B, C) is (1, 0, 1) and the read address (D, E, F) is (0, 1, 0). In this case, since, as described above, the output signal of the NOR circuit 302 of the data transfer control circuit 301 is "1", the output signal 308 of the inverter 306 becomes "0". As a result, the output signal of the NOR circuit 216 of the division circuit 206 depends on the logical value of the signal appearing on the second dynamic data line 115. Therefore, data transfer from the second memory group 111 to the first memory group 110 is enabled.

On the other hand, since the output signal of the NOR circuit 303 of the data transfer control circuit 301 is "0", the output signal 309 of the inverter 307 becomes "1". As a result, the output signal of the NOR circuit 215 of the division circuit 206 always becomes "0" irrespective of data on the first dynamic data line 114. That is, data transfer from the first memory group 110 to the second memory group 111 is inhibited.

In this manner, when the MSB of the write address is "1" and the MSB of the read address is "0", only the data transfer from the second memory group 111 to the first memory group 110 is enabled.

A description will next be made of an operation when the write address (A, B, C) is (0, 0, 1) and the read address (D, E, F) is (1, 1, 0). In this case, since the output signal of the NOR circuit 302 of the data transfer control circuit 301 is "0", the control signal 308 of the inverter 306 becomes "1". As a result, the output signal of the NOR circuit 216 of the division circuit 206 always becomes "0" irrespective of data on the second dynamic data line 115. Therefore, data transfer from the second memory group 111 to the first memory group 110 is inhibited.

On the other hand, since the output signal of the NOR circuit 303 of the data transfer control circuit 301 is "1" the control signal 309 of the inverter 307 becomes "0". As a result, the output signal of the NOR circuit 215 of the division circuit 206 depends on the logical value of data appearing on the first dynamic data line 114. That is, data transfer from the first memory group 110 to the second memory group 111 is enabled.

In this manner, when the MSB of the write address is "0" and the MSB of the read address is "1", only the data transfer from the first memory group 110 to the second memory group 111 is enabled.

In this embodiment, the data transfer direction is detected, and only the elements in the division circuit 206 which are necessary for the data transfer are caused to operate.. Therefore, power consumption-can further be reduced.

As described above in detail., in the memory device according to the invention, the dynamic data line division circuit is rendered conductive only when data is transferred to the other memory group. When data transfer is effected within the same memory group, the division circuit is rendered nonconductive and separated from the adjacent dynamic data lines. As a result, the consumption of powers for driving the dynamic data lines can be reduced.

Further, when data is transferred to the other memory group, the data transfer direction is detected and only the elements related to the transfer in the detected direction are driven. This enables a further reduction in power consumption.

What is claimed is:

1. A memory system comprising a plurality of memory groups each having a plurality of memory cells, a data line provided for each of the plurality of memory groups and commonly connected to the input/output terminals of the plurality of the memory cells of the memory group, and a memory controller for performing data input/output control on all of the memory cells individually, said memory system further comprising:

data line division means capable of performing connection and disconnection between the data lines of two arbitrary adjacent memory groups of the plurality of memory groups; and data transfer control means for causing the data line division means to connect the adjacent data lines only when data transfer is performed between the two adjacent memory groups in accordance with the data input/output control of the memory controller.

2. The memory system according to claim 1, wherein said data transfer control means causes the data line division means to connect the adjacent data lines bidirectionally only when data transfer is performed between the two adjacent memory groups.

3. The memory system according to claim 1, wherein said data transfer control means causes the data line division means to connect the adjacent data lines only in the direction of data transfer only when the data transfer is performed between the two adjacent memory groups.

4. The memory system according to claim 1, wherein said data line division means comprises:

first gate means capable of connecting the adjacent data lines only in a first direction from one of the two adjacent memory groups to the other; and second gate means capable of connecting the adjacent data lines only in a second direction that is opposite to the first direction.

5. The memory system according to claim 4, wherein said data transfer control means causes the first and second gate means to perform their data line connecting operations only when data transfer is performed between the two adjacent memory groups.

6. The memory system according to claim 4, wherein said data transfer control means causes one of the first and second gate means to perform its data line connecting operation in accordance with the direction of data transfer only when the data transfer is performed between the two adjacent memory groups.

7. The memory system according to claim 1, wherein a predetermined single bit of an address to be used for the data input/output control has a predetermined logical value for discriminating between the two adjacent memory groups.

8. The memory system according to claim 7, wherein said data transfer control means comprises:

first detection means for detecting at least the predetermined bit of the address; and second detection means for detecting, based on the detected predetermined bit, that data transfer is performed between the two adjacent memory groups.

9. The memory system according to claim 8, wherein said data transfer control means causes the data line division means to connect the adjacent data lines bidirectionally only when data transfer is performed between the two adjacent memory groups.

10. The memory system according to claim 8, wherein said second detectionmeans detects a direction of the data transfer receiving the predetermined bit of a write address and the predetermined bit of a read address.

11. The memory system according to claim 10, wherein said data transfer control means causes the data line division means to connect the adjacent data lines only in the detected data transfer direction only when data transfer is performed between the two adjacent memory groups.

12. A data transfer control method in a memory system comprising a plurality of memory groups each having a plurality of memory cells, a data line provided for each of the plurality of memory groups and commonly connected to the input/output terminals of the plurality of the memory cells of the memory group, a memory controller for performing data input/output control on all of the memory cells individually, and a data line division circuit for performing connection and disconnection of the data lines of two arbitrary adjacent memory groups of the plurality of memory groups, said method comprising the steps of:

detecting data transfer occurrence between the two adjacent memory groups by monitoring the data input/output control of the memory controller; and connecting the adjacent data lines only when data transfer occurs between the two adjacent memory groups.

13. The method according to claim 12, wherein said connecting step comprises a step of connecting the adjacent data lines bidirectionally only when data transfer occurs between the two adjacent memory groups.

14. The method according to claim 12, wherein said connecting step comprises a step of connecting the adjacent data lines only in the direction of data transfer only when the data transfer occurs between the two adjacent memory groups.

15. The method according to claim 14, wherein said connecting step comprises the steps of:

connecting the adjacent data lines in the direction of data transfer only when the data transfer occurs between the two adjacent memory groups; and disconnecting the adjacent data lines in the opposite direction of the data transfer.

* * * * *